United States Patent
Fernandez et al.

[11] Patent Number: 6,081,180
[45] Date of Patent: Jun. 27, 2000

[54] TOROID COIL HOLDER WITH REMOVABLE TOP

[75] Inventors: Claude Fernandez, Palatine; Glynn Russell Ashdown, Lake Bluff, both of Ill.

[73] Assignee: Power Trends, Inc., Warrenville, Ill.

[21] Appl. No.: 09/158,089

[22] Filed: Sep. 22, 1998

[51] Int. Cl.⁷ .................................................. H01F 15/02
[52] U.S. Cl. .............................. 336/90; 336/65; 336/229
[58] Field of Search ................................ 336/90, 96, 65, 336/60, 229

[56] References Cited

U.S. PATENT DOCUMENTS

| | | |
|---|---|---|
| 2,533,673 | 12/1950 | Lasserre . |
| 2,917,724 | 12/1959 | Jackson . |
| 3,465,273 | 9/1969 | Brock . |
| 3,603,917 | 9/1971 | Owen ........................................ 336/65 |
| 4,221,148 | 9/1980 | Lewis . |
| 4,748,405 | 5/1988 | Brodzik et al. . |
| 4,769,625 | 9/1988 | Meindl ..................................... 336/65 |
| 4,888,571 | 12/1989 | Kobayashi et al. ...................... 336/65 |
| 5,015,981 | 5/1991 | Lint et al. . |
| 5,262,745 | 11/1993 | Gutierrez . |
| 5,276,279 | 1/1994 | Brownlie et al. ....................... 174/65 R |
| 5,306,870 | 4/1994 | Abat . |
| 5,309,130 | 5/1994 | Lint . |
| 5,534,838 | 7/1996 | Lindberg . |
| 5,719,547 | 2/1998 | Kaneko et al. . |
| 5,789,712 | 8/1998 | Barry et al. ........................ 174/138 G |

FOREIGN PATENT DOCUMENTS 2690780  11/1993  France ..................................... 336/90

*Primary Examiner*—Michael L. Gellner
*Assistant Examiner*—Anh Mai
*Attorney, Agent, or Firm*—Hill & Simpson

[57] ABSTRACT

A housing for a toroid coil has side walls closely formed around the coil and a top connected at a gap from the side walls by attachments. The top provides a flat, relatively smooth vacuum pick up surface for mounting the coil on a circuit board and is removable by breaking off the attachments. The side walls have a front wall with wire wrap posts extending therefrom positioned so that the wire of the coil lies in the mounting plane for surface mount connection when wrapped on the posts. Slots are provided in the front wall to receive the wire to prevent cutting or scoring of the wire or its coating or cover during removal of the top. The back of the walls is open to reduce length and thickened supports are provided at the edges of the walls adjacent the back.

21 Claims, 1 Drawing Sheet

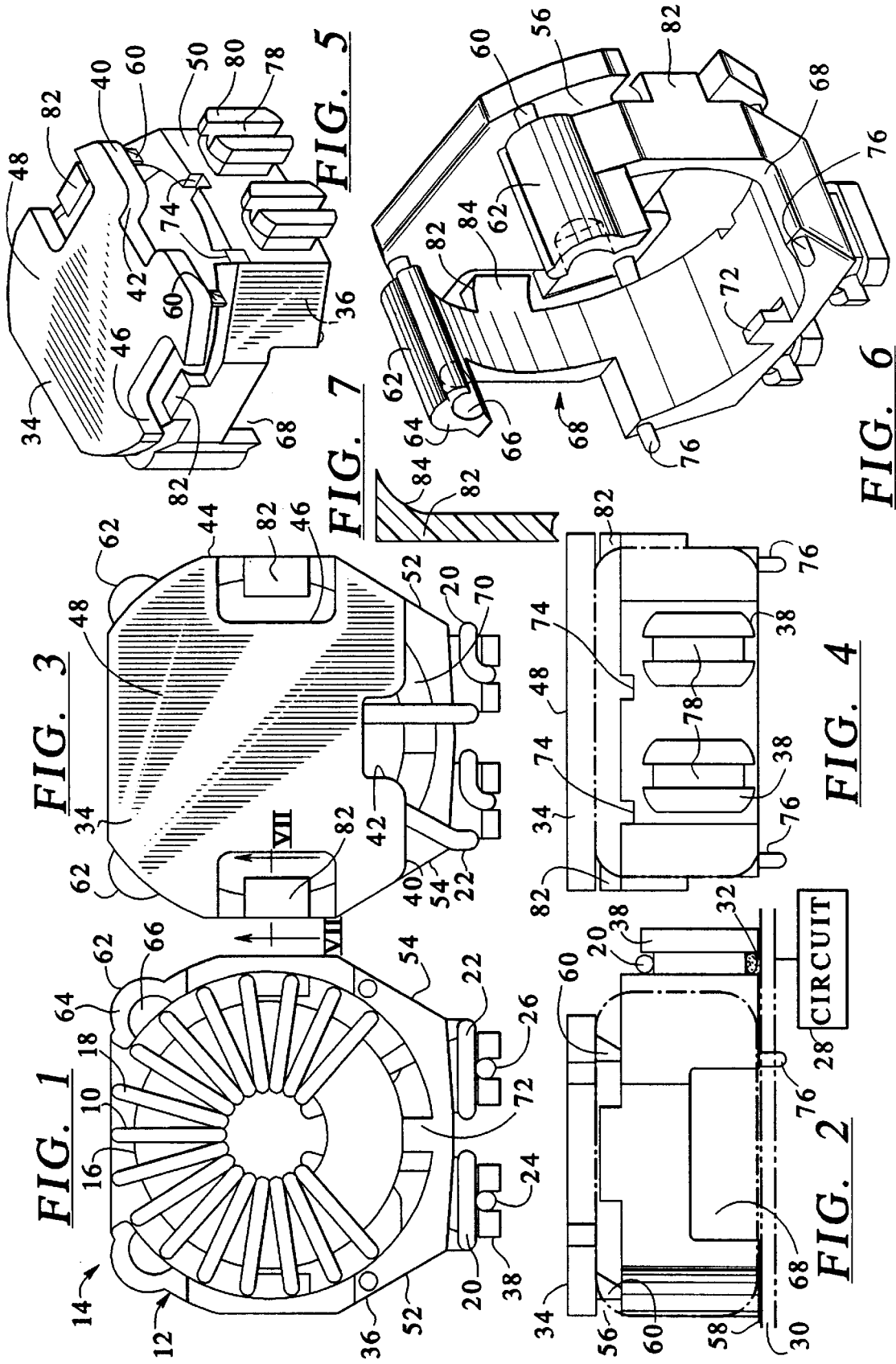

TOROID COIL HOLDER WITH REMOVABLE TOP

BACKGROUND OF INVENTION

1. Field of Invention

The present invention relates generally to a holder for a toroid coil and, more particularly, to a toroid holder that enables automated mounting of the toroid coil on a circuit board.

2. Description of Related Art

Toroid coils are used in electrical circuits such as those provided on circuit boards. The shape of the toroid coil makes mounting of the coil on a circuit board and electrically connecting the coil in the circuit time consuming and difficult, especially when mounting is attempted by automated circuit board equipping machinery.

The use of a holder into which the coil is mounted and the addition of a vacuum pick up surface to the toroid coil holder has improved manufacturer's ability to use automated circuit board equipping machinery to install the toroid coils. A toroid coil is placed in a holder with a vacuum pick up surface. Then, an automated circuit board equipping machine with a vacuum pick up nozzle can engage the holder by the holder's vacuum pick up surface. The machine can then position the toroid and holder on a printed circuit board and mount the toroid in place. This process can be repeated with minimal human labor and a considerable savings in time and money.

Further considerations are necessary, however, to optimize toroid coil holder design and the installation process. These considerations include the size of the holder, structural integrity of the holder, stability of the coil within the holder, ease of installing the toroid coil in the holder, ease of accurately placing and mounting the toroid coil on the circuit board, strength of the mounting to the circuit board, the ability to machine mold the holder, and the ability of fluids to escape the holder during the rinsing procedure in circuit board manufacturing.

SUMMARY OF THE INVENTION

An object of the present invention is to provide an improved holder for a toroid coil which permits the toroid to be picked up, held, and positioned by automated circuit board equipping machinery.

A further object of the present invention is to provide a holder for a toroid coil which provides a vacuum pick up surface and from which the vacuum pick up surface can be removed after the toroid coil is mounted to the circuit board.

Another object of the present invention is to provide a holder for a toroid coil that occupies the least amount of space possible.

Another objective of the present invention is to provide a holder for a toroid coil that maximizes the structural integrity of the holder within its spacial and material limitations.

Another objective of the present invention is to provide a holder for a toroid coil that conforms to the shape of the coil to improve stability of the toroid coil within the holder.

Another objective of the present invention is to provide a holder for a toroid coil that minimizes the difficulty of installing the toroid coil within the holder.

Another objective of the present invention is to provide a holder for a toroid coil that is easy to place and mount on the circuit board.

Another objective of the present invention is to provide a holder that is securely mounted on the circuit board.

Another objective of the present invention is to provide a holder that can be machine molded in large quantities.

Another objective of the present invention is to provide a holder for a toroid coil which prevents fluids from becoming trapped within the holder.

An embodiment of the present invention is a toroid holder assembly for mounting on a circuit board. The toroid holder assembly has a planar top member which provides a vacuum pick up surface by which the toroid assembly is picked up for positioning on a circuit board. The holder also has side walls substantially perpendicular to the planar top member and adjacent the planar top member's edges, including a front side wall, and first and second lateral side walls. The lower edges of the side walls define a mounting plane for the holder that is positioned on a circuit board. The planar top member, the side walls, and the mounting plane define a cylindrical toroid containment space conforming essentially to the external dimensions of a toroid coil. The toroid coil is positioned within the toroid containment space.

The planar top member and the upper edges of the sidewalls are spaced apart from one another by a detachment gap. A plurality of attachment members extend across the detachment gap to connect the planar top member and the side walls. The top member may be removed from the holder by breaking off the attachment members to reduce the height of the holder after it is mounted on a circuit board. The attachment members have a downwardly angled front edge and a decreasing cross-sectional area from the portion connected to the planar top member to the portion connected to the side walls so that when the attachment members are broken, the break is at the side walls. This ensures that the attachment members are removed along with the top member, for lower overall height of the holder after installation.

The rear edges of the first and second lateral side walls do not meet and so define a rear opening therebetween which is opposite the front side wall. Each of the side walls is reinforced by first and second half cylinder support members that are proximate the rear edges of the side walls. The lower edges of the half cylinder support members have contact surfaces at the mounting plane of the holder. The contact surfaces each have a recess for accommodating adhesive used for mounting the holder to a surface to securely adhere the holder to the circuit board. To prevent liquids used in processing from becoming trapped inside the holder, the lateral side walls define rectangular fluid flow gaps in the medial portions of their lower edges. A support rib protrudes from an interior surface of the front side wall to support the toroid coil in a desired position within the toroid containment space.

The front edge of the planar top member is set back from the front wall to provide a wire access gap which enables the wire of the coil to be easily passed out to the exterior of the holder. Two notches in the upper edge of the front wall accommodate the wire then the wire is in the position for connection to the circuit board. One of the notches in the upper edge of the front wall is angled relative to the thickness direction of the wall in the preferred embodiment.

Two wire wrapping posts extend from the front wall generally in a direction parallel to the mounting plane. The posts are adjacent to the mounting plane such that when the wire of the toroid coil is wrapped about the posts, the wire extends into the mounting plane and into contact with surface mount connections for electrically connecting the toroid coil in a circuit. The wire which has been wrapped around the toroid-shaped core to form the coil has its ends extending out of the toroid containment space and are wrapped around the two wrapping posts. An enlargement is provided at the end of each of the wrapping posts to prevent the wire which is wrapped about the wrapping posts from slipping off the end. The distance between the enlargement and the front wall of the holder is generally equal to or slightly greater than the diameter of the wire such that wrapping posts each accommodate a single wrapping of the wire. The enlargements have an end slot into which the wire is inserted after being wound about the wrapping posts. Each end slot extends vertically from the lower edge of the enlargement to the upper edge of the enlargement and holds the free ends of the wire in place.

At least one guide pin extends from the lower surface of the holder through the mounting plane for engagement into an opening in the mounting circuit board to assure proper placement. Preferred embodiments of the holder have a second guide pin and possibly a third guide pin extending through the mounting plane for positive positioning of the toroid holder assembly. Alternatively, two guide pins may extend through the mounting plane from a front contact surface formed from the lower edge of the front side wall, the lower edge of the front portion of the first lateral side wall, and the lower edge of the front portion of the second lateral side wall.

In one embodiment, coil restraints are provided extending from side walls of the holder to engage the coil and prevent the coil from moving out of its preferred position, particularly after the top portion is removed from the holder.

The invention also provides a method of mounting a toroid coil. A toroid coil is positioned in a toroid coil holder having a planar top member with a vacuum pick up surface. The ends of the wire of the toroid coil extends out of the holder and is wrapped around a pair of wrapping posts extending from the toroid coil holder. Adhesive may be placed either on a surface of the circuit board in a predetermined location or on the mounting plane of the holder for mounting the toroid coil on the circuit board surface. Solder is applied on the surface of the circuit board at locations beneath the wrapping posts for connecting the toroid coil electrically in a circuit. An equipping machine engages the vacuum pick up surface of the holder with a vacuum pick up nozzle and positions the toroid coil holder on the circuit board surface in the desired location. Heat is applied to liquify the adhesive and reflow the solder in order to adhesively connect the holder to the board and electrically connect the toroid coil to the circuit. The circuit board is then washed to remove flux and other debris from the soldering process, the present holder having openings from which the wash fluid can escape. When the height of the circuit must be kept small, such as for compact electronic devices, the planar top member of the holder is severed from the side walls of the toroid coil holder so that the height of the toroid coil holder is decreased to the height of the coil would occupy without the holder.

BRIEF DESCRIPTION OF THE DRAWINGS

FIG. 1 is an underside view of the toroid holder assembly of the present invention;

FIG. 2 is a side view of the toroid holder assembly;

FIG. 3 is an overhead view of the toroid holder assembly;

FIG. 4 is a front view of the toroid holder without the toroid coil;

FIG. 5 is an oblique overhead view of the toroid holder without the toroid coil;

FIG. 6 is an oblique underside view of the holder without the toroid coil with an alternative guide posts configuration; and FIG. 7 is an enlarged fragmentary view of a coil restraint along the line in FIG. 3.

DETAILED DESCRIPTION OF THE PREFERRED EMBODIMENTS

In FIGS. 1, 2 and 3, a toroid coil 10 is shown positioned within a toroid coil holder 12 to form an assembly 14. FIGS. 4, 5 and 6 show views of the toroid coil holder 12 without the toroid coil positioned within.

The toroid coil 10 consists of a toroid-shaped core 16 composed of a material with electromagnetic properties appropriate to the specific application of the toroid coil (such a ferromagnetic material). The toroid core 16 is wrapped by a wire 18 in a plurality of windings around the core. The wire 18 has a first lead portion 20 and a second lead portion 22 which extend away from the toroid core 16 and engage the toroid coil holder 12. The first lead portion 20 has an end 24 and the second lead portion 22 has an end 26. The lead portions 20 and 22 electrically connect the toroid coil 10 with a circuit 28 such as the circuit on a printed circuit board 30. The circuit 28 has contact areas 32 of solder on the surface to which the holder 12 is mounted; however, it is possible that holder may be mounted on a surface other than the one having the circuit 28 and would be connected by, for example, wire leads. The wire 18 wrapped about the core has its lower edges at a lower toroid coil plane and the upper edges at an upper toroid coil plane.

The holder 12 includes a planar top member 34, side walls 36, and winding posts 38. The holder 12 is made of a plastic material which is molded using known machine molding techniques for mass production of plastic components.

The planar top member 34 is positioned above the side walls 36 such that the side walls 36 are generally perpendicular to the planar top member 34 and are positioned proximate edges of the planar top member 34. The planar top member 34 has a generally octagonal shape substantially corresponding to the octagonal shape defined by the side walls 36. The planar top member 34 has a front edge 40 set back from the front of the housing with a cutout 42, a rear edge that extends to the rear of the housing, and lateral side edges 44 with cutouts 46. The planar top member 34 has an upper surface 48 which is substantially smooth to provide a vacuum pick up surface for the holder 12. The vacuum pick up surface 48 allows the holder and the toroid coil positioned within to be picked up by an automated circuit board equipping machine or other machine or apparatus with a vacuum pick up nozzle. Once the vacuum pick up nozzle has engaged the vacuum pick up surface the holder 12 can then be positioned in a predetermined location on a mounting surface. The planar top member 34 also has a lower surface that defines the upper limit of the toroid containment space.

The side walls 36 define a generally octangular shape of holder 12. The side walls 36 have an upper edge and a lower edge 126 and also have an interior surface which is generally circular to define the toroid containment space. The toroid containment space conforms to the external dimensions of toroid coil 10 in order to provide a close fit of the coil in the housing for stability of the coil within the holder and to minimize the external dimensions of the holder. The side walls 36 have an external surface which is generally comprised of flat surfaces which meet at obtuse angles. These surfaces include a front wall 50 and first and second lateral side walls 52 and 54. The first lateral side wall 52 is composed of a front surface portion, a medial surface portion, and a rear surface portion. The second lateral side wall 54 is similarly shaped.

The external surface of front side wall 40 is one side of holder 12's octagonal shape. The external surfaces of front surface portion, the medial portion, and the rear portion of first and second lateral side walls 52 and 54 each generally define three more sides of the octagonal shape. Rear edges of the first and second lateral side wall 52 and 54 are spaced apart to define a rear opening therebetween which corresponds to the last side of the octagonal shape.

Since no wall is provided at the rear portion of the holder, the length of the holder is shorter and does not extend past the rear of the coil 10. This minimizes the external dimensions of assembly 14, specifically the length of the holder measured from front to rear. Further, the rear opening allows fluid to escape the holder during the washing process.

The lower surface of the planar top member 34 and the upper edges of the side walls 36 are spaced apart to define a detachment gap 56. The detachment gap 56 is of a height to accommodate a molding steel of sufficient thickness to be used in repeated moldings for the mass production of the holder 12. Further, the detachment gap 56 is of sufficient width to accommodate a break-off tool for separating the planar top member 34 from the rest of the holder 12. The height of the assembly 14 with the planar top member 34 when it is mounted on a circuit board 30 is measured from a mounting plane 58, which is defined by the lower edges of the side walls 36, to the upper surface 48. This height may be decreased by at least the thickness of the planar top member when the planar top member 34 is removed. The toroid coil may often be the tallest circuit element on the circuit board 30, so that the height of the coil determines the clearance required for the circuit board in the direction perpendicular to the circuit board. Removal of the top member 34 from the coil housing 12 decreases the height required for the coil and typically also for the circuit board, enabling more compact electrical devices to be provided while still permitting the coil to be automatically mounted. This reduction in height is accomplished after the coil has been installed on a circuit board or other surface and no longer requires a vacuum pick up surface.

The planar top member 34 is attached to the side walls 36 by attachments 60. The attachments 60 may comprise any type of connection between the planar top member 34 and the side walls 36. The preferred embodiment employs four attachment members 60 extending from the upper edges of the side walls 36 and the lower surface of the planar top member 34. However, any number of structural attachments between any portion of the planar top member 34 and the remainder of the assembly 14 can be provided, as well as less structural means such as adhesive bonds. The attachment members 60 each have a substantially triangular cross-sectional shape in a plane parallel to the mounting plane 58 and are pyramid shaped when viewed from the side. One pair of attachment members 60 extend from the upper edge at the front portion of the first and second lateral side walls 36 to the lower surface of the planar top member 34 proximate the side edges. The attachment members 60 decrease in cross-sectional area from where they engage the planar top member 34 to where they engage the side walls 36. Another pair of attachment members 60 extends from the upper edge at the rear portion of the first and second lateral side walls 36 to the lower surface of the planar top member 34 proximate the side edges. These attachment members 60 also decreases in cross-sectional area from where they engage the planar top member 34 to where they engage the side walls 36. The decreases in cross-sectional area of the attachment members 60 ensure that a break away tool breaks the attachment members as close to the upper edge of the side walls 36 as possible during the removal of the top member 34 from the body of the holder to that the attachment members remain on the top member. The break away tool is inserted only to the depth of the wall thickness to avoid scoring the wire and is twisted to break off the top.

The side walls 36 further include vertical support members 62 protruding from the rear external surface of the side walls. The vertical support members 62 have a two-fold purpose of enhancing the structural integrity of the holder at the open rear face and providing an enlarged contact surface at the gluing plane for mounting the holder to the circuit board 30. In the preferred embodiment, the vertical support members 62 are of a first half cylinder member shape. The half cylinder-shaped member 62 protrudes from the external surface at the rear portion of the lateral side walls 36 proximate their rear edges and extends vertically from the lower edge to the upper edge. The vertical support members 62 are of a sufficiently small radius that it does not increase the overall width of the holder 12, or the overall length of the holder.

The lower edge of the side walls 36 at the rear portion and the half cylinder-shaped members 62 provide rear contact surfaces 64. The rear contact surfaces 64 provide a surface area for the application of adhesive for mounting the holder to a surface, such as the circuit board 30. A recess 66 is provided in the rear contact surfaces 64 for accommodating an adhesive to provide a stronger bond with the holder. In the preferred embodiment, the recess 66 is a semicircular-shaped recess in the first rear contact surfaces 64 adjacent the internal surface extending upward in the vertical support members 62. The recess 66, also termed a glue relief, of a preferred embodiment is 0.020 inches deep.

The lower edges of the first and second lateral side walls 36 are cut away at gap 68 to reduce the footprint of the holder so that components can intrude into the mounting space. In other words, adjacent components may lie under the overhang formed by the cut away. The gap 68 also allows fluids to flow out of the toroid containment space during the washing process which follows soldering. In the preferred embodiment, the gap 68 is a rectangular recess located in the medial portion of the lateral side walls 36. The gap 68 extends into the front portion and the rear portion of the side walls.

The front edge 40 of the planar top member 34 and the upper edge at the front wall 50 define a wire access gap 70 therebetween. The front edge 40 is set back from the plane of the front wall 50 to increase the size of the wire access gap 70. Recessing the front edge widens the gap 70 for accessing the lead portions 22 and 20 of the wire 18. The front edge 40 also has the cut out 42 which is rectangular in shape and allows access to a support rib 72 during the molding of holder 12. The upper edge of the front wall 50 has two slots 74, both of sufficient width and depth to accommodate the wire 18 as it passes through the wire access gap. The slots 74 permit the wire to lie below the plane of the top edges of the side walls 36 to prevent the wire from being cut or scored as the top 34 is removed from the holder. One of the slots 74 is angled relative to the front side wall 50 to accommodate the wire as it comes off the toroid coil to better guide the lead portion 22 toward the winding post 38.

The support rib 72 protrudes from the internal surface at the front wall 50. The support rib 72 helps properly position and support toroid coil 10 during and after installation of the coil in holder 12. Specifically, the support rib 72 prevents the front of the toroid coil 10 from being positioned below mounting plane 58 when the lead portions 20 and 22 of the wire 18 are pulled through the wire access gap 70. It is important that the lower surface of the toroid coil plane 10 not extend below the mounting plane 58 since this could prevent proper positioning of the assembly 14 on the circuit board. The support rib 72 is an extension of the lower edge of the front wall 50 at the mounting plane 58 and has a curved upper surface, which is curved from the internal surface to a rear edge of the support rib 72. The upper surface engages the toroid coil 10 to help properly position the coil.

The holder 12 has a plurality of guide pins 76 for positioning the assembly 10 in a predetermined location on a surface. The guide pins 76 extend from the lower edges of the side walls 36 through the mounting plane 58. The guide pins 76 extend into holes bored in the circuit board 30 to ensure proper placement of the assembly 14. The guide pins 76 should be sufficiently spaced along the lower edges to provide proper orientation of the holder 12 with the small number of pins. The preferred guide pin cross section shape is circular. The guide pins may have a flat end, but hemispherical or conical ends are preferred.

In one embodiment, the holder 12 possesses of the three guide pins 76. A first guide pin is positioned on the lower edge at the support rib 72, and the second and third guide pins 76 are on the lower surface of the front portion of the side walls 36. The three pins provide a high degree of accuracy in both directions for orienting the assembly 10. Other arrangements of the guide pins are also contemplated.

The wrapping posts 38 extend from the external surface at the front wall 50 in a direction generally parallel to the mounting plane 58 and adjacent to the mounting plane such that when the wire ends 20 and 22 are wrapped around the wrapping posts 38, the wire extends to the mounting plane so that it can be soldered to contacts 32 on a circuit board surface. The wrapping posts 38 are sufficiently short such that they accommodate only a single wrapping of wire 18 on each post. Further the wrapping posts 38 each contain a groove 78 in the end into which the ends of the wire 18 is inserted such that the wire is held in place without requiring further fastening.

The wrapping posts 38 have an enlargement 80 at the end away from front wall 50 for preventing the lead portions 20 and 22 which are wrapped about the wrapping posts 38 from slipping off The enlargement 80 has a rear surface facing the front wall 50 spaced from the front wall such that the distance I–J is generally equal to or slightly larger than the diameter of the wire 18 such that the first wrapping posts 38 accommodate a single wrapping of the wire. The end slot 78 is in the enlargement 80. The enlargement 80 extends a greater distance from the posts at upper and lower parts. The sides are narrowed for clearance during winding of the wire 18.

The holder 12 has an additional feature to restrain the coil 10 from movement after the top 34 has been removed. In particular, side restraints 82 are formed by upwardly extended medial portions of the side walls 36. The side restraints 82 are provided at the two opposite sides of the holder and have an inwardly curving coil engaging surface 84. The side restraints 82 are of a height just below the underside of the planar top 34. When the top 34 is removed, the side restraints 82 hold the coil down without extending above the coil and increasing the height of the holder. Vibration resistance is increase.

A method of making and using the preferred embodiment begins with mass producing the toroid coil holder 12 by known plastic molding techniques. A toroid coil 10 is positioned in the holder 12. The wire 18 from the coil is passed through the wire access gap 70 and wrapped around wrapping posts 38 on the holder to form an assembly 14. A plurality of the assemblies 14 are placed on a tape and reel for systematic dispensing at the site where the assemblies are to be mounted to mounting surfaces, such as might be found on a circuit board 30. The mounting surface is provided and drilled with guide holes in predetermined locations to accept the guide pins 76, solder it provided at contact pads 32 connected to electrical circuitry, and adhesive is placed on the mounting surface 64 on the vertical support members 62 for mounting the holder to the surface. The conductive solder 32 is placed on the mounting surface at predetermined locations corresponding to contact points where the wire ends 20 and 22 on the wrapping posts 38 meets the mounting plane 58. A vacuum pick up nozzle of an equipping machine engages the vacuum pick up surface 48 of holder 12. The holder 12 and the resident toroid coil 10 are removed from the tape and reel and positioned on the mounting surface at the predetermined location such that the holder's guide pins 76 engage the holes in the mounting surface 230, the holder's contact surfaces engage adhesively to the mounting surface, and the wire wrapped on the wrapping posts 38 contacts the conductive solder. The vacuum pick up nozzle disengages from the vacuum pick up surface 48. The assembly is are exposed to heat in order to reflow the solder thus mounting the holder 12 to the circuit board 30 and electrically connecting the coil 10 to the circuit 28. The adhesive and solder combination ensures that the assembly is firmly attached to the mounting surface such that it cannot be easily jarred loose, even when the planar top member is severed from the holder. A break-off tool is used to sever the planar top member 34 from the holder 12 to reduce the height dimension of the assembly 14. Specifically, the height is decreased to provide greater clearance around the mounted assembly. The mounted holder is washed to remove debris from the manufacturing process, particularly the flux from the solder reflow. Various gaps in the side walls of the holder 12 allow excess fluid to escape entrapment within the holder. The process of mounting the assembly is repeated with the plurality of assemblies on the tape and reel to mass produce circuit boards.

Although other modifications and changes may be suggested by those skilled in the art, it is the intention of the inventors to embody within the patent warranted hereon all changes and modifications as reasonably and properly come within the scope of their contribution to the art.

We claim:

1. A toroid holder assembly for mounting on a circuit board, comprising:

a planar top member having edges;

side walls substantially perpendicular to said planar top member, said side walls being adjacent to the edges of said planar top member and defining a toroid containment space between said side walls and below said planar top member and above a mounting plane for the toroid holder, said side walls having a lower edge defining an open bottom of said toroid holder opposite said planar top member sufficient to pass a toroid coil into said toroid containment space;

said planar top member and an upper edge of said side walls being spaced apart to define a detachment gap therebetween;

attachments connecting said planar top member and said side walls across said detachment gap; and a toroid coil positioned in said containment space, said toroid coil having a core and a wire wrapped around said core.

2. The toroid holder assembly of claim 1, wherein said attachments include a plurality of attachment members extending between said planar top member and the upper edge of said side walls.

3. The toroid holder assembly of claim 2, wherein ones of said plurality of attachment members include break locations which when broken result in said planar top member being free of said side walls so that said planar top member may be removed from said side walls to decrease an external dimension of the toroid holder assembly.

4. The toroid holder assembly of claim 3, wherein said break locations are portions of decreased cross-sectional area of said attachment members.

5. The toroid holder assembly of claim 4, wherein said portions of decreased cross-sectional area of said attachment members are adjacent the upper edge of said side walls.

6. The toroid holder assembly, for mounting on a circuit board, comprising:

a planar top member having edges;

side walls substantially perpendicular to said planar top member, said side walls being adjacent to the edges of said planar top member and defining a toroid containment space between said side walls and below said planar top member and above a mounting plane for the toroid holder;

said planar top member and an upper edge of said side walls being spaced apart to define a detachment gap therebetween;

attachments connecting said planar top member and said side walls across said detachment gap, said attachments including a plurality of attachment members extending between said planar top member and the upper edge of said side walls, ones of said plurality of attachment members include break locations which when broken result in said planar top member being free of said side walls so that said planar top member may be removed from said side walls to decrease an external dimension of the toroid holder assembly;

a toroid coil positioned in said containment space, said toroid coil having a core and a wire wrapped around said core; and at least one retention claw extending into said toroid containment space in engagement with said toroid coil for holding said toroid coil in position after removal of said planar top member.

7. The toroid holder assembly of claim 3, wherein said planar top member has a tool receiving edge set back from said side walls to define a tool receiving gap so that said planar top member is removed by being engaged at said tool receiving.

8. The toroid holder of claim 1, further comprising:

at least one guide pin extending from a lower portion of said holder through the mounting plane for positioning the toroid holder assembly on a surface.

9. The toroid holder of claim 8, wherein said at least one guide pin includes a plurality of guide pins extending from a lower portion of said holder through the mounting plane for positioning the toroid holder assembly on a surface.

10. A method of mounting a toroid coil, comprising the steps of:

positioning a toroid coil in a toroid coil holder having a top member with a vacuum pick up surface;

engaging the vacuum pick up surface with a vacuum pick up nozzle of an equipping machine;

positioning said toroid coil holder on a mounting surface in a predetermined mounting location;

connecting said toroid coil electrically to a circuit; and removing said top member from said toroid coil holder so that an external dimension of the toroid coil holder is decreased.

11. The method of claim 10, further comprising the step of:

applying adhesive between the mounting surface and an adhesive receiving portion of said toroid coil holder having an adhesive receiving recess for adhesively mounting said toroid coil holder on the mounting surface.

12. A toroid holder assembly for mounting on a circuit board, comprising:

a top member having edges;

side walls substantially perpendicular to said top member and adjacent to the edges of said top member and defining a toroid containment space between said side walls and below said top member and above a mounting plane for the toroid holder, said side walls defining at least one opening extending from said mounting plane to said top member and having two opposite edges at said opening, said two opposite edges extending from said mounting plane to provide clearance adjacent said toroid holder; and a toroid coil disposed in said containment space, said toroid coil having a core and the wire wrapped around said core.

13. The toroid holder assembly of claim 12, further comprising:

vertical support members protruding from an external surface of said side walls adjacent said at least one opening.

14. The toroid holder assembly of claim 13, wherein said vertical support members are half cylinder-shaped members.

15. The toroid holder assembly of claim 13, wherein said vertical support members include lower contact surfaces at said mounting plane.

16. The toroid holder assembly of claim 15, wherein said lower contact surfaces define recesses for accommodating adhesive.

17. The toroid holder of claim 12, further comprising:

at least one guide pin extending from a lower portion of said holder through the mounting plane for positioning the toroid holder assembly on a surface.

18. The toroid holder assembly of claim 12, further comprising:

a plurality of guide pins on a lower edge of said side walls extending through the mounting plane for positioning the toroid holder assembly on a surface.

19. The toroid holder assembly of claim 12, wherein said at least one opening is at a back of said toroid holder, and wherein said side walls include first and second lateral side walls, and said first and second lateral side wall define further openings as gaps at said mounting plane.

20. The toroid holder assembly of claim 19, wherein said gaps in said first and second lateral side walls each have a rectangular shape and are located in a medial portion of a lower edge of said first and second lateral side walls.

21. A toroid holder assembly for mounting on a circuit board, comprising:

a planar top member having edges;

side walls substantially perpendicular to said planar top member, said side walls being adjacent to the edges of said planar top member and defining a toroid containment space between said side walls and below said planar top member and above a mounting plane for the toroid holder, said side walls defining at least one opening and having two opposite edges at said opening, said two opposite edges extending from said mounting plane to provide clearance at said mounting plane adjacent said toroid holder;

vertical support members protruding from an external surface of said side walls adjacent said at least one opening said planar top member and an upper edge of said side walls being spaced apart to define a detachment gap therebetween;

attachment members connecting said planar top member and said side walls across said detachment gap, said attachment members include break locations which when broken result in said planar top member being free of said side walls so that said planar top member may be removed from said side walls to decrease an external dimension of the toroid holder assembly, said break locations being portions of decreased cross-sectional area of said attachment members; and a toroid coil positioned in said containment space, said toroid coil having a core and the wire wrapped around said core.

* * * * *